United States Patent [19]
Patillon et al.

[11] Patent Number: 5,825,156
[45] Date of Patent: Oct. 20, 1998

[54] SYSTEM FOR MONITORING CHARGING/DISCHARGING CYCLES OF A RECHARGEABLE BATTERY, AND HOST DEVICE INCLUDING A SMART BATTERY

[75] Inventors: Jean-Noël Patillon, Paris; Olivier Gerard, Saint-Maur, both of France

[73] Assignee: U.S. Philips Corporation, New York, N.Y.

[21] Appl. No.: 736,758

[22] Filed: Oct. 25, 1996

[30] Foreign Application Priority Data

Oct. 31, 1995 [FR] France ................................. 95 12864

[51] Int. Cl.⁶ .................................................. H01M 10/46
[52] U.S. Cl. ................................ 320/21; 320/30; 320/39
[58] Field of Search ................................. 320/5, 12, 13, 320/9, 21, 27, 28, 29, 30, 39, 48

[56] References Cited

U.S. PATENT DOCUMENTS 5,606,242  2/1997  Hull et al. .................................. 320/48

FOREIGN PATENT DOCUMENTS 5-244729  9/1993  Japan .
6-245403  9/1994  Japan .

OTHER PUBLICATIONS

"Neural Networks—A proper Approach to the Energy Management Problem?" by Marcus Stoll in 10th European Photovoltaic Solar Energy Conference, 8–10 Apr. 1991, Lisbon, Portugal, pp. 427–430.

"Adaptive System for Smart Battery Management Based on Neural Networks" by Olivier Gerard, Sep. 1995.

Yung et al., "A Microcontroller–based battery charger using neural–fuzzy technology," $3^{rd}$ Int. Symposium on Consumer Electronics, vol. 2, pp. 277–282, IEE, Hong Kong, 1994.

*Primary Examiner*—Edward Tso
*Attorney, Agent, or Firm*—Robert M. McDermott

[57] ABSTRACT

System for monitoring the discharging/charging cycles of a rechargeable battery which includes adaptive calculation means for providing a predictive indication of when the battery will reach a critical discharge voltage. The adaptive calculation means includes parameters which can be modified by other adaptive calculation means so as to optimize the monitor's performance depending on the battery's actual use. The adaptive calculation means may be neural networks formed by a microprocessor and memory, and the monitor system may be coupled to a host system.

31 Claims, 9 Drawing Sheets

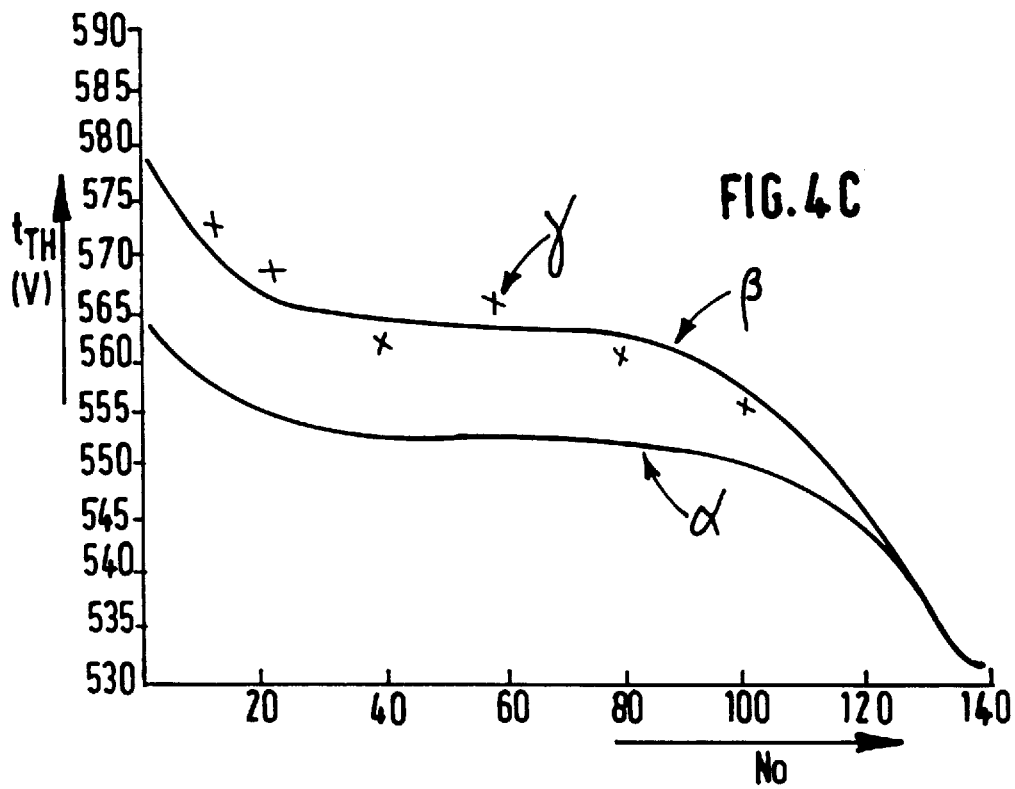
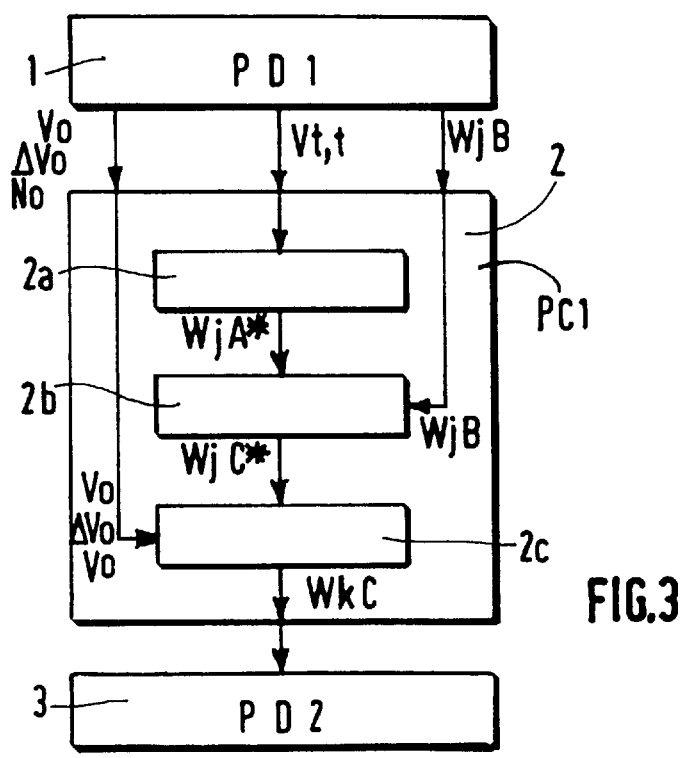

5,825,156

SYSTEM FOR MONITORING CHARGING/DISCHARGING CYCLES OF A RECHARGEABLE BATTERY, AND HOST DEVICE INCLUDING A SMART BATTERY

DESCRIPTION

1. Field of the Invention

The invention relates to a monitoring system for monitoring discharging/charging cycles of a rechargeable battery to form a smart battery. The invention likewise relates to a host device which includes a smart battery.

The invention finds its application in the field of modular apparatus equipped with a rechargeable battery such as, for example: private or professional cellular telephones, cordless tools, portable computers, toys . . .

A smart battery is generally understood to mean a rechargeable battery coupled to a system that monitors its state of charge. This system comprises means for collecting data on the state of charge of the battery and means for producing calculated predictive information signals relating to the discharging conditions in the future.

A technical problem posed when predictive information signals about the discharging conditions in the future are determined for a rechargeable battery depends on the variability of the manufacturing parameters of the battery and on the variability of the habits of the user of the host device.

The variability of the manufacturing parameters of the battery considered separately is due to the spreading of the structure data during manufacturing for the same type of battery.

The variability of the user habits leads to improper use which may damage the battery and affect the later recharging possibilities. These habits of improper use comprise charging for too long a lapse of time, or frequent recharging of a battery that is hardly discharged.

Another technical problem also depends on the fact that the current applications of the rechargeable batteries require very high precision relating to the amount of energy available at a given instant.

2. Background of the Invention

A system for monitoring the state of charge of a battery, utilizing a neural network, is already known from the publication entitled "NEURAL NETWORK, A PROPER APPROACH TO THE ENERGY MANAGEMENT PROBLEM", by MARCUS STOLL IN "10TH EUROPEAN PHOTOVOLTAIC SOLAR ENERGY CONFERENCE", 8–10 APR. 1991, LISBON. PORTUGAL, pages 427–430".

The cited publication describes the use of a neural network for undertaking the task of estimating the state of charge (SOC) of a lead-acid battery in a recharging system (RES). According to cited document, determining the state of charge is an important task that is to be carried out to monitor the energy level of a battery. More particularly, the estimation of the state of charge makes it possible to plan the use of the renewable energy, to optimize the conditions of use of a host device, and to make decisions concerning the various periods of the discharging/charging cycles of the battery.

A neural network is involved, with a data base, in estimating the state of charge. To reduce the cost, the neural network is involved in only a small part of the discharging domain of the battery. As the discharge current is very small during most of the time, the involvement of the neural network lies in this domain.

In the learning period of the neural network a data base is used including the discharge current, the discharge voltage and the state of charge under standard conditions of use, that is to say, at a fixed temperature of 20° C. and with a fixed current. In addition, this data base may include information relating to discharging cycles and to what degree the discharge has taken place and relating to the average temperature of the battery. The various batches of these data, which form input vectors, are applied to the neural network to inform the network of the discharging behavior of the batteries. The neural network is arranged for a suitable representation of the behavior of the battery.

In the classification period of the neural network, only the discharge current and voltage are applied thereto and it produces on its output the corresponding state of charge of the battery.

A problem which results from the use of the known system is that this system is unable to directly predict the lapse of time that is left before a critical discharge voltage threshold is reached.

Another problem which results from the use of the known system is that the data corresponding to the number of previous charging/discharging cycles and to the degree of discharge in these cycles, cannot be correctly taken into account. Indeed, these data are highly variable as a function of the actual use that is made of the battery during operation, and largely influence the real state of charge present in the battery at a given instant of a discharging cycle, whereas in the known system of cited document the weights of the neural network are ultimately fixed from the end of the learning period.

SUMMARY OF THE INVENTION

It is an object of the present invention to provide a system for monitoring battery discharging/charging cycles which produces predictive information relating to the instant at which a predetermined critical threshold of the battery discharge voltage will be reached and, more particularly, predictive information relating to the remaining lapse of time that is left from each current instant of use onwards until the instant at which this predetermined critical threshold of discharge voltage will be reached.

It is an object of the present invention to provide a system for monitoring battery discharging/charging cycles which produces such predictive information that automatically adapts itself to new voltage data which vary with each discharging period of the battery as a function of the number of discharging/charging cycles already effected previously.

It is an object of the present invention to provide such a monitoring system which produces such predictive information, which information adapts itself to the new real voltage data which vary with each discharging period of the battery, relative to the said voltage data, because of the spreading in the behavior of each individual battery relative to an average behavior.

These problems are resolved by a monitoring system for monitoring discharging/charging cycles of a rechargeable battery, coupled to a rechargeable battery which has discharging periods alternating with charging periods according to discharging/charging cycles, this system comprising:

first adaptive calculation means which are arranged for collecting at the beginning of a discharging period of a discharging/charging cycle of the battery a batch of operating parameters called first parameters, and for receiving on the input a predetermined value of a critical discharge voltage threshold, and which are arranged for providing on the output a calculated predictive indication of the instant at which the battery will reach this critical threshold that corresponds to the end of this discharging period, this system also comprising:

second and third adaptive calculation means coupled to the first calculation means, which are arranged for receiving on the input, at an initial instant, at the beginning of said discharging period of the battery, a value of the battery voltage called initial voltage, a value of a variation of this initial voltage after a short lapse of time starting from this initial instant, and a value of the initial number of discharging/charging cycles of this battery effected before said discharging period, and which are arranged for producing on the output from the instant of said discharging period at which the initial values are available, a batch of approximate parameters and a batch of corresponding correction parameters respectively, which are added together to form said first operating parameters imposed on said first calculation means.

These problems are particularly resolved by a system such as defined previously, also comprising:

a read/write memory area for recording during said discharging period batches of instantaneous real values formed each by a discharge voltage measurement of the battery and by the current instant corresponding to this measurement, and a calculator, in which system during the battery charging period following said discharging period of the respective discharging/charging cycle:

the first calculation means are furthermore arranged for calculating and producing a posteriori in an autonomous manner, parameters called real parameters which correspond to the operation of these first calculation means in the situation when the batches of instantaneous real values are imposed on them, while the discharge voltage measurement is imposed on the input and the corresponding current instant is imposed on the output, the calculator is arranged for receiving said approximate parameters calculated by the second calculation means during the discharging period, and said real parameters calculated by the first calculation means during the charging period, and for producing respective differences between these parameters called error parameters, and the third calculation means are arranged for calculating autonomously parameters called adaptive parameters which correspond to the operation of these third calculation means in a situation when the error parameters are imposed on them, on the output, whereas the initial values of the previous discharging period are imposed on them, on the input, and in which system the third calculation means save as operating parameters in the later discharging period of the next discharging/charging cycle the adaptive parameters calculated in said charging period.

In a particular embodiment, these problems are resolved by a monitoring system as defined previously, in which:

the first, second and third calculation means are formed by a first, second and third neural network respectively, the first operating parameters are the synaptic coefficients of the first neural network, the first neural network having an input cell for a voltage value and an output cell for a time value, the second neural network having three input cells for said initial values and a number of output cells for the approximate parameters having a like quantity to the synaptic coefficients of the first neural network, and the third neural network having three input cells for said initial values and a number of output cells for the correction parameters having a like quantity to the number of synaptic coefficients of the first neural network, and in which monitoring system:

the calculator is arranged for receiving and adding together the approximate parameters and the correction parameters and for producing said synaptic coefficients imposed on the first neural network.

In another particular embodiment, these problems are resolved by a monitoring system as defined previously in which:

the first neural network, which forms the first calculation means, is arranged for calculating during the charging period that follows the discharging period of the respective discharging/charging cycle, by a reverse propagation method, real parameters which are its own real synaptic coefficients, in the situation when for each batch of instantaneous real values the discharge voltage measurement is imposed on its input, and the corresponding current instant is imposed on its output, the calculator is arranged for producing the error parameters formed by the respective differences between said real synaptic coefficients calculated by the first neural network during said charging period, and said approximate parameters calculated by the second neural network for said previous discharging period, the third neural network forming the third calculation means is arranged for calculating, via a reverse propagation method, adaptive parameters which are its own adaptive synaptic coefficients, in the situation when the error parameters are imposed on its outputs and the initial values of the previous discharging period are imposed on its inputs, and this third neural network in the subsequent discharging period of the next discharging/charging cycle maintains these adaptive synaptic coefficients calculated in said charging period.

The advantage of this monitoring system in either one of these two embodiments is that the predictive indications are adapted to the individual characteristics of discharging/charging the battery to which this monitoring system is coupled, either for a given type of battery, or for various types of batteries, because this monitoring system offers the advantage of being adaptive to any new discharging/charging cycle.

Another advantage is that these predicted indications are precise and very reliable.

Another advantage is that these indications relate to a measurement which permits the user of making a host device that comprises such a "smart" battery operate in the best conditions of use.

In a mode of application of the invention, a host device is fed by a rechargeable battery and comprises such a monitoring system coupled to this battery.

The advantage of this system is that it is simple to use. The host device coupled to this system performs particularly well.

BRIEF DESCRIPTION OF THE DRAWINGS

The invention is described in more detail with reference to the accompanying drawings, of which

FIG. 3 represents a block diagram symbolizing the stages of the learning procedure of the three neural networks of the monitoring system in the charging period which follows the discharging period, for acquiring an adaptive function;

FIG. 4C represents discharging time curves of a battery plotted against the number of discharging/charging cycles, in α without the third adaptive calculation means, in β with the third predictive and adaptive calculation means, and in γ with measured real values;

DESCRIPTION OF PREFERRED EMBODIMENTS

Figure 5A:
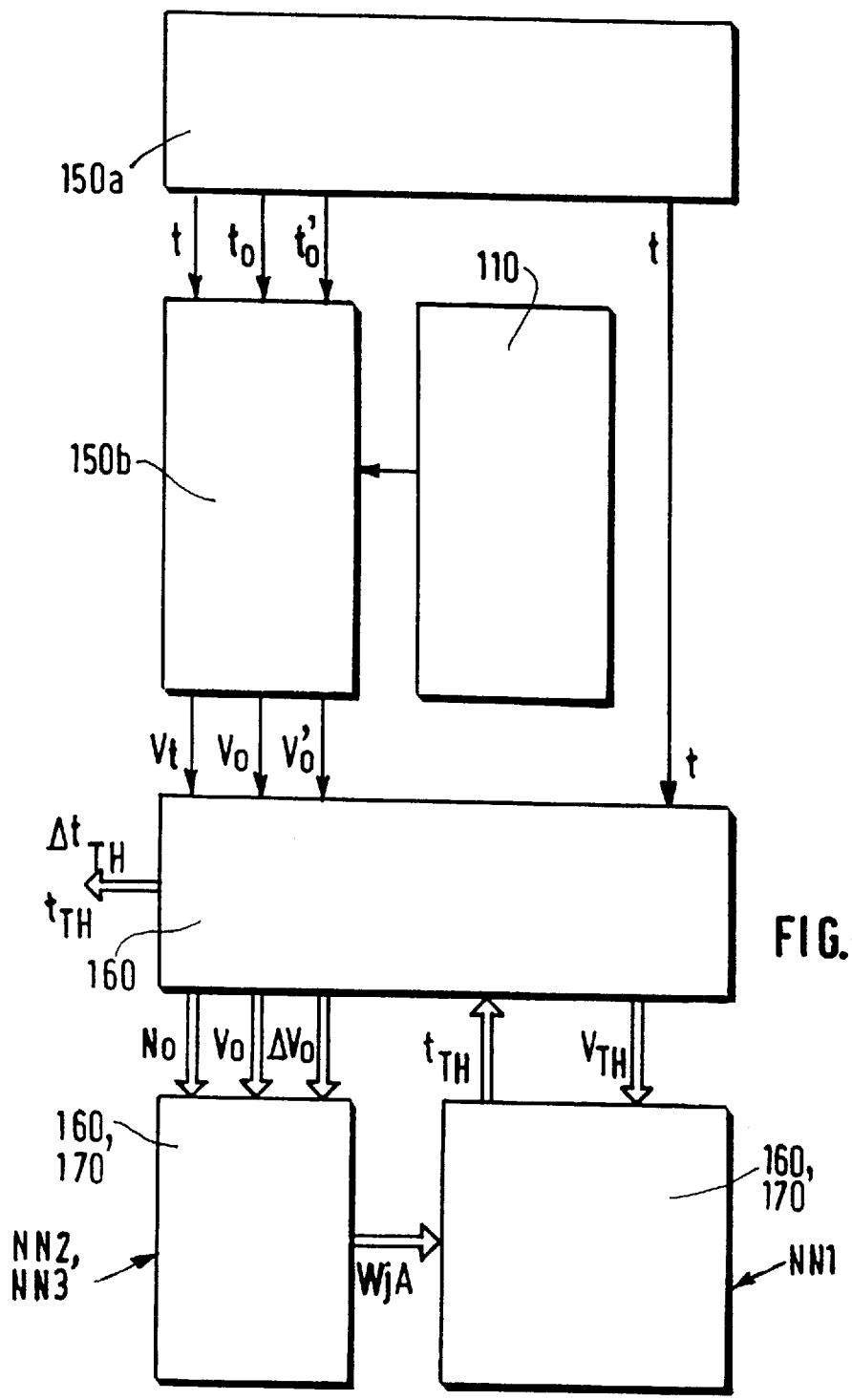
FIG. 5A represents the elements for operating a monitoring system.
Figure 5B:
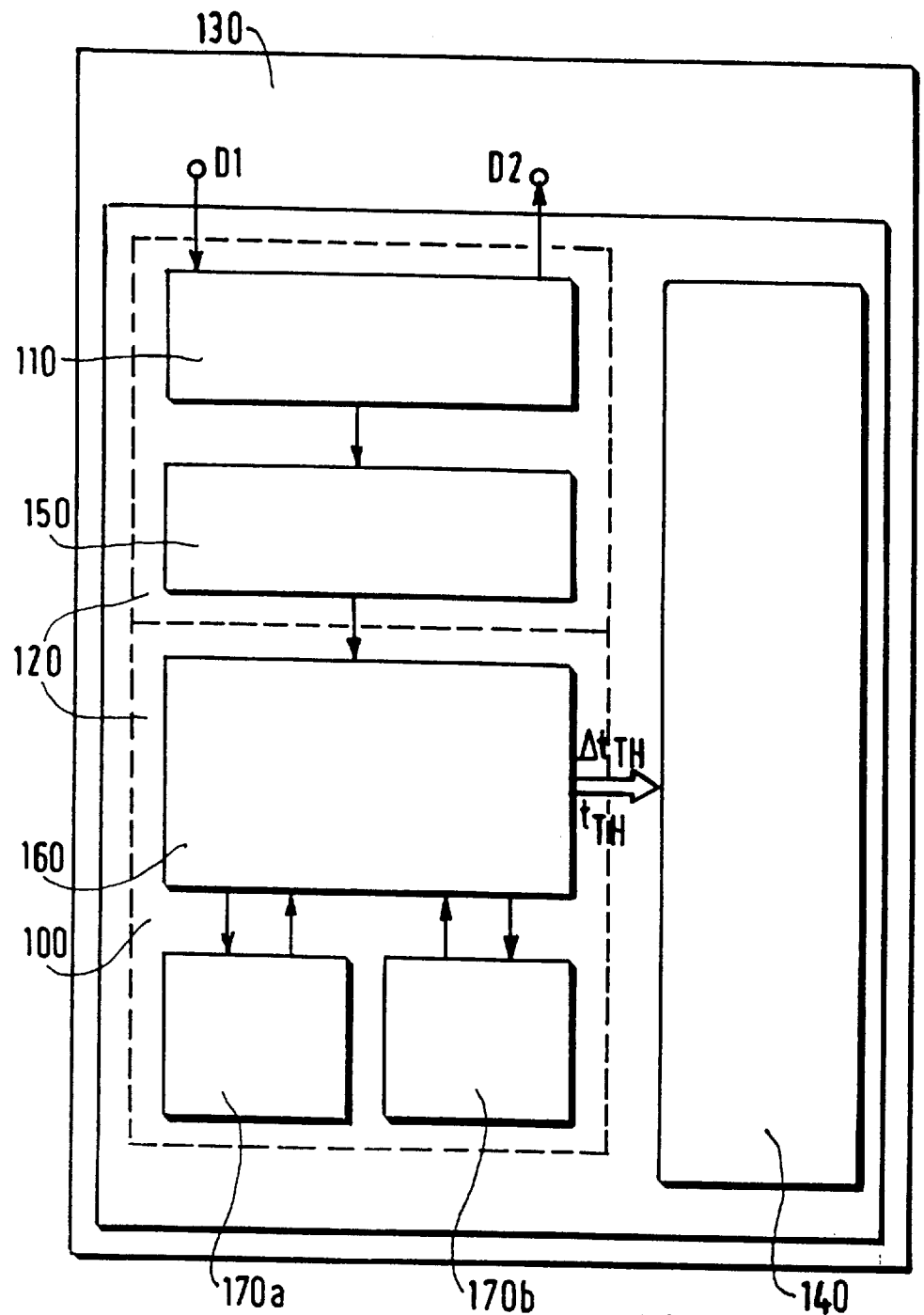
FIG. 5B represents a monitoring system in a host system.

With reference to FIG. 5B of which the legend is stated in Table II, a monitoring system 100 is coupled to a rechargeable battery 110 to form a total system called smart battery 120. This rechargeable battery has charging periods alternating with discharging periods in consecutive discharging/charging cycles. The monitoring system 100 monitors the discharging periods and possibly charging periods of the discharging/charging cycles of the rechargeable battery. This monitoring system 100 comprises a calculator 160 for producing an indication of an instant $t_{TH}$ at which, in a discharging period, the battery 110 will reach a predetermined critical voltage threshold $V_{TH}$ and, more specifically, for producing an indication of the lapse of time $\Delta t_{TH}$ which is still to go before this predetermined critical threshold of the discharge voltage $V_{TH}$ is reached, or also the two indications. The ensemble of this smart battery may be incorporated in, or coupled to, this host device 130. In that case this rechargeable battery 110 is coupled by connections D1, D2 to this host device 130. The host device further comprises display means 140 for providing the user with time indications $t_{TH}$ or $\Delta t_{TH}$, or the two.

The monitoring system 100 is also coupled to measuring means 150 for measuring time and the battery voltage.
Operating Procedure of the Monitoring System 100 During a Discharging Period, of a Discharging/Charging Cycle.

Figure 1A:
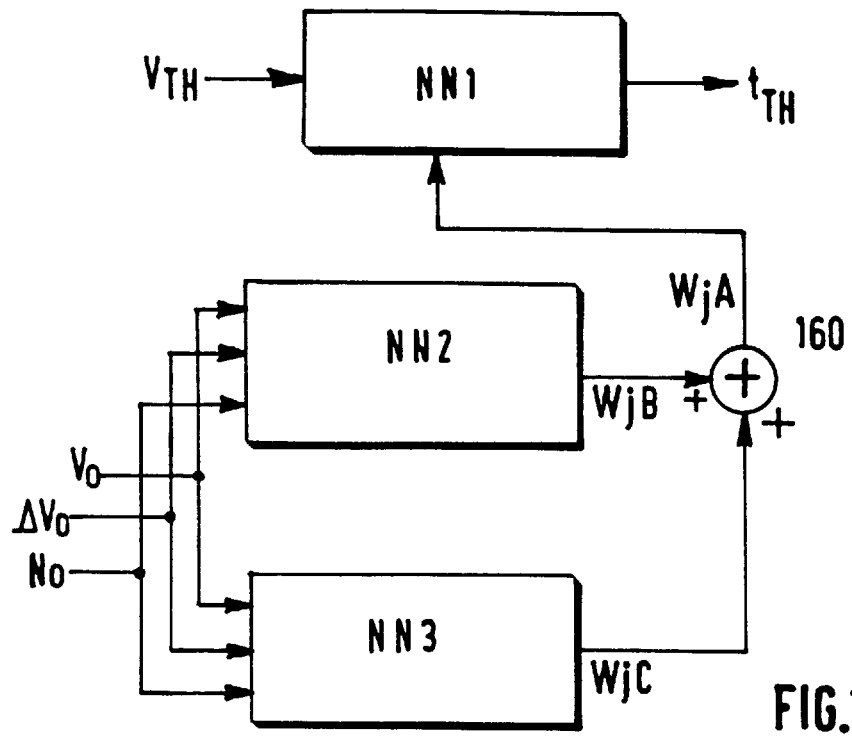
FIG. 1A represents a monitoring system for a rechargeable battery, for forming an overall system called smart battery, operating in a discharging period of a discharging/charging cycle.

With reference to FIG. 1A which represents the monitoring system which operates in a discharging period of the battery, this monitoring system 100 obtains, on the one hand, values called initial values at an instant called initial instant to, which coincides with the very beginning of a discharging period of the battery in a discharging/charging cycle. These initial values are:

Vo the battery voltage, Vo thus being called initial battery voltage at this initial instant to;

ΔVo the variation of the battery voltage also called initial voltage variation, measured during a first lapse of time Δto which is very short, in which the battery is used between the initial instant to and a later instant t'o=to+Δto;

No the number of discharging/charging cycles of the battery already effected prior to the initial instant to under consideration; No may be equal to 0 (zero) as required, if the considered cycle is the first using cycle of the battery, formerly new and never having been recharged; No is called initial cycle number.

This system 100 may obtain, on the other hand, instantaneous values at each successive current instant t of this same discharging period. The instantaneous values are:

Vt the battery voltage at a current instant t and the corresponding instant t.

With reference to FIG. 1A, a system 100 for monitoring discharging/charging cycles of a rechargeable battery 110 comprises first, second and third coupled adaptive and predictive calculation means NN1, NN2, and NN3, respectively, for providing, on the basis of initial voltage values Vo, ΔVo, No measured in a discharging period, and on the basis of the fixed value of a critical voltage threshold $V_{TH}$, the predictive indication of an instant called critical instant $t_{TH}$ at which, in the same discharging period, the battery voltage will reach this critical threshold $V_{TH}$, and more specifically, a predictive indication of the lapse of time $\Delta t_{TH}$ that is still to go before this critical discharge voltage threshold $V_{TH}$ is reached, this threshold being predetermined so that before the battery voltage reaches this threshold $V_{TH}$, the battery 110 retains operating energy that is precisely known and is situated in a certain range where this energy is correctly adapted to the operation of a host device 130 it supplies power to.

As is shown in FIG. 1A, in an embodiment, the first, second and third adaptive and predictive calculation means of the monitoring system 100 are formed, respectively, by a first neural network referenced NN1, a second neural network referenced NN2 combined in series with the first neural network NN1, and the third neural network NN3 combined in parallel with the second neural network.

In the description that follows, a first discharging period denoted PD1 commencing at an instant to in a discharging/charging cycle is considered first; and a predetermined critical threshold of discharge voltage $V_{TH}$ is fixedly determined.

The first neural network NN1 has an input for:

the voltage $V_{TH}$ which forms the predetermined critical threshold, and has an output for producing at each current instant t, for example, every minute:

the instant $t_{TH}$ at which this predetermined critical threshold of the voltage $V_{TH}$ is reached.

With reference to FIG. 5A of which the legend is stated in Table I, the first neural network NN1 is coupled to time measuring means 150a which produces a measurement of each current instant t and is coupled to the calculator 160 which has a function of adder and which produces as a difference between the current instant t and the calculated value of the instant $t_{TH}$:

a value $\Delta t_{TH}$ of the lapse of time that is left to pass until the predetermined critical threshold of discharge voltage $V_{TH}$ is reached, in the case where the battery is in normal operation for supplying power to a host system 130, and is normally discharged because of this operation.

In this illustrative embodiment, there are thirteen synaptic coefficients or weights of this first neural network NN1 and they are referenced WjA where j is an index from 1 to 13.

They are called first parameters WjA and are calculated and produced automatically during the first discharging period PD1 by the second neural network NN2 which cooperates with the third neural network NN3.

The second neural network NN2 has three inputs for:

Vo the initial voltage measured at the initial instant to of this first discharging period PD1, ΔVo the variation of the initial voltage at an instant t'o positioned after a short lapse of time Δto reckoned after the initial instant to, for example, 1 minute, No the initial number of cycles, and has thirteen inputs for thirteen parameters WjB called approximate parameters, which contribute to the formation of the synaptic coefficients or weights WjA of the first neural network NN1.

The third neural network NN3 has the same inputs as the second neural network NN2, that is to say, 3 inputs for:

Vo the initial voltage measured at the initial instant to of this first discharging period PD1, ΔVo the variation of the initial voltage at an instant t'o indicated after a short lapse of time Δto reckoned after the initial instant to, for example, 1 minute, No the initial number of cycles, and has thirteen outputs for thirteen correction parameters WjC for respectively correcting the thirteen approximate parameters WjB coming from the second neural network NN2.

The calculator 160, which has a function of adder, produces among other things the value of the initial variation of the voltage Δto by calculating the difference between the initial voltage Vo measured at the instant to, and a subsequent voltage V'o measured at the next instant t'o, so that Δvo=Vo−V'o.

This calculator 160 further produces in its function of adder the synaptic coefficients or weights WjA necessary for the functioning of the first neural network during this first discharging period PD1, by effecting the addition of the approximate parameters WjB which come from the second neural network and correction parameters WjC which come form the third neural network.

The thirteen respective results WjA=WjB+WjC are imposed on the first neural network during this first discharging period PD1 as first operating parameters.

With reference to FIG. 5B, of which the legend is stated in Table II, the monitoring system 100 further comprises RAM memory areas 170b for recording or producing, as the case may be, the variable measures and the weights of the first and third neural networks, and a ROM memory area 170a for storing the structure data of the neural networks NN1, NN2 and NN3, the fixed parameters and the weights of the second neural network NN2.

These memories are accessible via the calculator 160 which performs the necessary calculations for the operation of the monitoring system 100.

Each of the neural networks NN1, NN2 and NN3 is to be organized (or arranged) for bringing these calculations to a successful issue and producing these output signals. With this object in view, each of them is subjected to a learning procedure and to a test procedure called learning period during which their synaptic coefficients are determined and, in certain cases, fixed.

Learning Procedure of the Neural Networks

The task of the first neural network NN1 is to learn discharging curve models. This learning makes it possible to form a relation between the instantaneous value of the battery discharge voltage denoted Vt and the current instant t at which the battery reaches this voltage Vt. The first neural network NN1 is to form, during its learning period, functions Fw which resolve the relation (1a):

$$t = Fw(Vt) \tag{1a}$$

where the index w assigned to F symbolizes the fact that the function F is linked with the weights WjA, or synaptic coefficients, of the first neural network NN1.

The neural network NN1 has been formed to generate a non-linear function Fw.

Figure 2A:
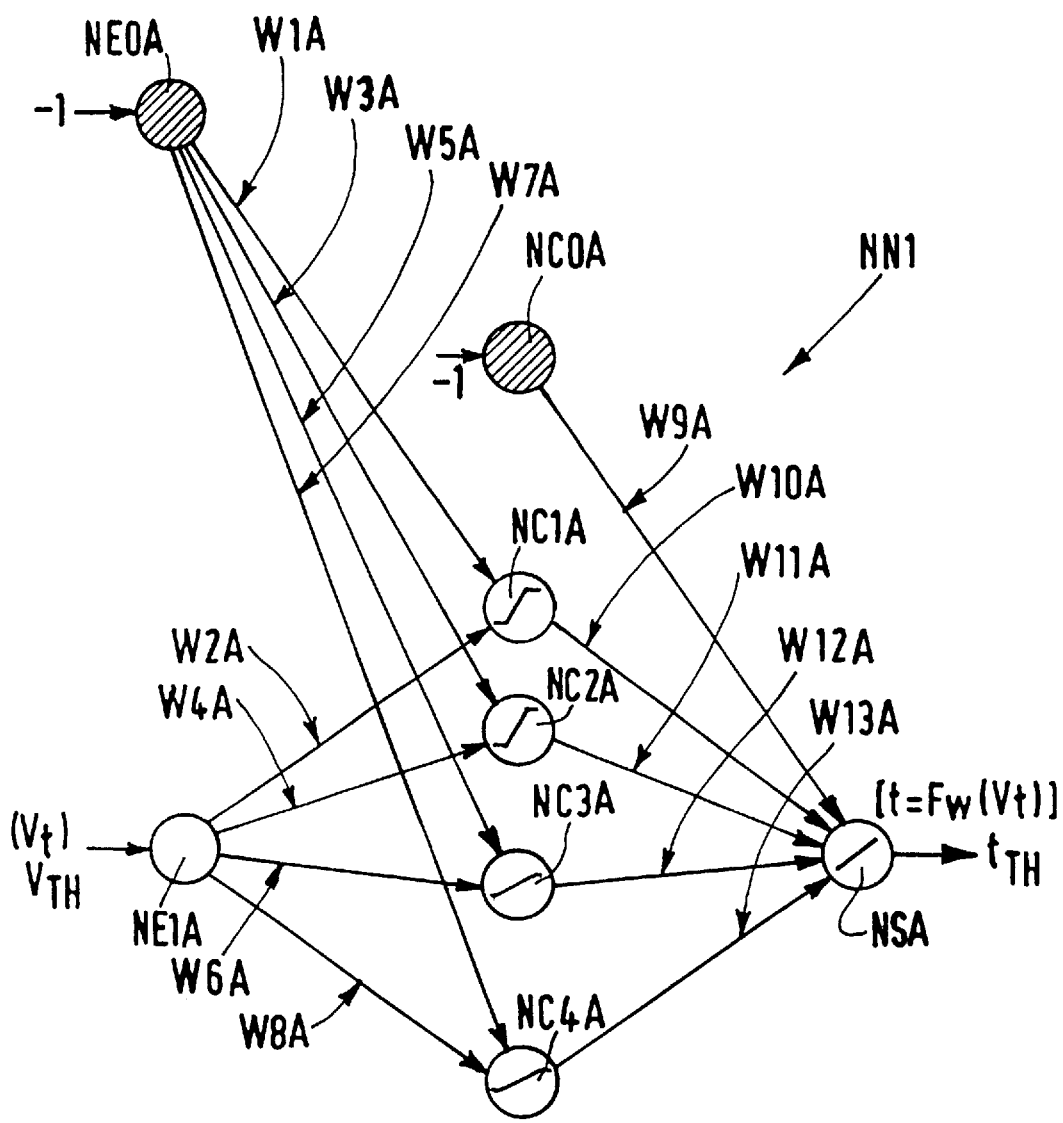
FIG. 2A represents a first neural network NN1.

With reference to FIG. 2A, the first neural network NN1 comprises:

an input layer formed by two neural cells which include a first neural cell EC0A for inputting a threshold voltage selected to be −1, and a second neural cell EC1A for inputting the instantaneous voltage value Vt at the instant t, a hidden layer of five neural cells which include a first hidden neural cell NC0A for inputting a threshold value selected to be −1, and four hidden neural cells denoted NC1A to NC4A, and an output layer which has a single neural cell denoted NSA.

Thus, there is observed that, during the learning procedure of the first neural network NN1, its input EC1A receives an instantaneous voltage value Vt, whereas this same input receives the value of the critical voltage threshold $V_{TH}$ during current use.

Figure 6A:
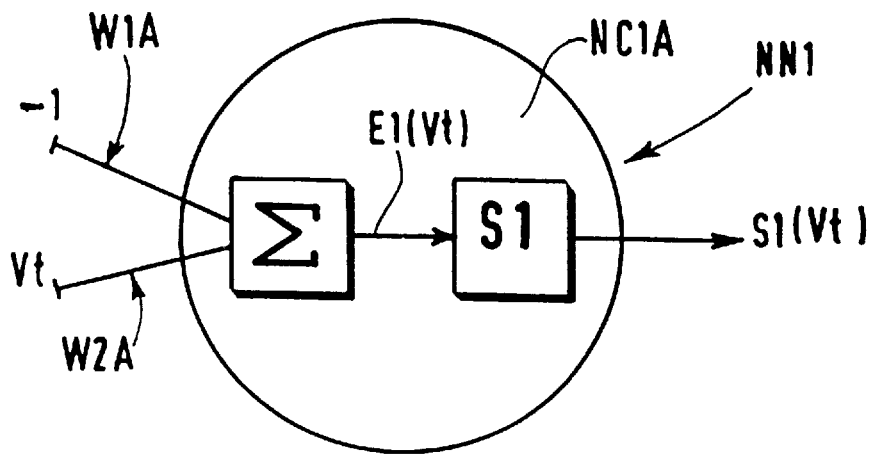
FIG. 6A represents the structure of a neural cell of the hidden layer of the first neural network NN1 of the monitoring system.

The structure and the operation equation of each hidden neural network, denoted NC1A to NC4A, are cells of a formel (standard) neuron, and are illustrated by FIG. 6A which shows the hidden cell NC1A by way of example.

Each given hidden neuron NCiA receives on the input the instantaneous voltage Vt with an input weight or input synaptic coefficient which is one of the thirteen weights referenced WjA, and also receives a threshold which has the constant "−1" as its value, bearing another one of the thirteen weights referenced WjA. The index "i" is the index 1 to 4 of the respective hidden neural cell NC1A to NC4. Each hidden neuron NCiA produces a weighted sum denoted Σ of the inputs bearing one of the thirteen weights WjA and calculates an intermediate output signal Ei(Vt).

Each hidden neuron NC1A to NC4A transfers this intermediate output signal Ei(Vt) via an activation function denoted Si and calculates an output signal denoted Si(Vt) in accordance with the relation (2a):

$$Si(Vt) = Si[Ei(Vt)] \tag{2a}$$

The activation function Si(Vt) of each hidden neuron thus remains to be defined better. As a possible activation function may only be adopted a function selected from the set of non-linear functions.

The activation function Si is preferably a sigmoidal function "tanh", equal to the tangential hyperbolic function which is well adapted to the form of the discharging curves to be made, as will be shown later. In the hidden layer, the 4 neural cells CN1A to CN4A thus show in the described example a non-linear function "tanh".

Figure 6B:
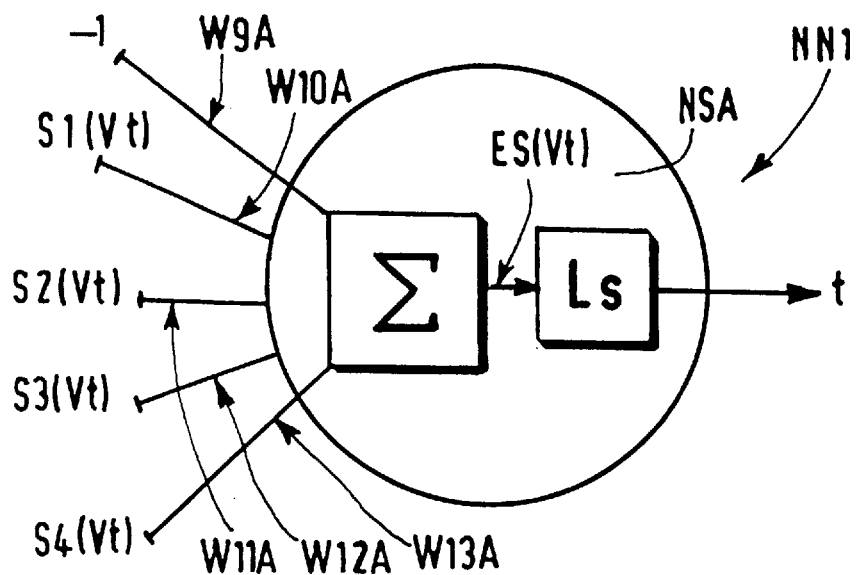
FIG. 6B represents the structure of the neural output cell of this same first network NN1.

The structure of the sole output neuron NSA is illustrated by FIG. 6B. A weighted sum is realized, denoted Σ, of the output signals Si(Vt) of all the hidden neurons NCiA, by utilizing synaptic coefficients WjA, to which sum is added the value of a "−1" threshold coming from the hidden cell NC0A, this threshold value being introduced in the output neuron NSA via one of the synaptic coefficients WjA.

This output neuron thus first produces the weighted sum Σ which gives an intermediate output signal Es(Vt).

Then, the neuron of output NSA transfers this intermediate output signal Es(Vt) via an activation function denoted Ls, and calculates a final output signal denoted Fw(Vt) according to the relation (3a):

$$Fw(Vt)=Ls[Es(Vt)] \tag{3a}$$

The activation function Ls of this output neuron is selected to be linear. The output signal of the output neuron is the function Fw one seeks to generate.

The notations of the weights of each hidden neuron NCiA are indicated in FIG. 2A as are the notations of the input weights of the output neuron NSA. The set of these weights denoted W1A to W13A is formed by the set of the thirteen weights WjA transmitted by the second and third neural networks NN2 and NN3 connected in parallel, whose outputs are coupled by the calculator 160 in its function of adder.

Figure 4A:
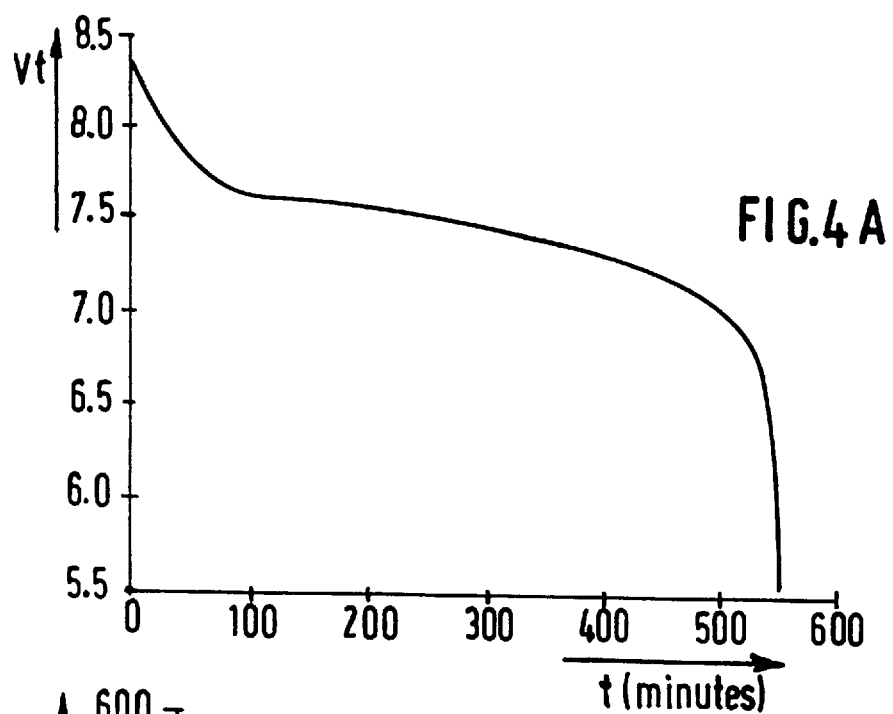
FIG. 4A represents a curve of the discharge voltage of a battery plotted against time.

With reference to FIG. 4A, a conventional discharging curve of a nickel-cadmium battery taken by way of example shows the instantaneous voltage Vt in volts plotted against time t in minutes. This curve shows a steep slope in the first operating period of the battery, for example, the 100 first minutes, followed by a slight slope between 100 and 500 minutes of use, and finally again a steep slope beyond the 500 minutes. Of course it will be evident that this discharging curve is given totally by way of example.

But, in the present system it will be recollected that the first neural network NN1 is to undergo a learning period which leads to producing a time t which is a function Fw of the voltage Vt of the battery.

Figure 4B:
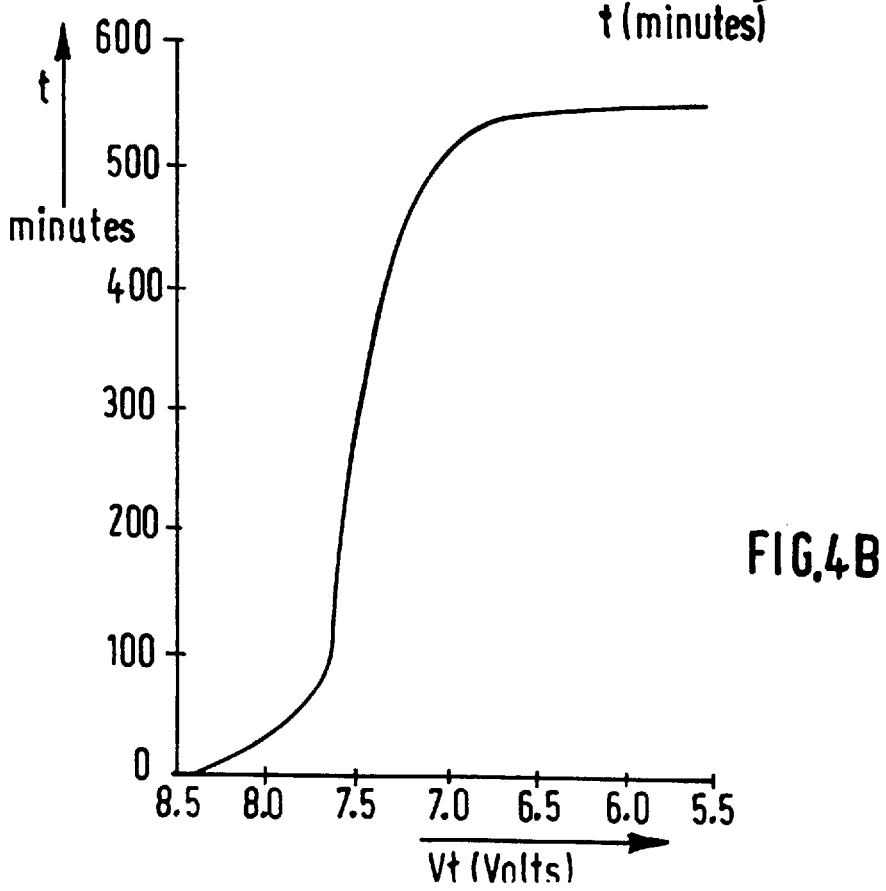
FIG. 4B represents a discharging time curve of a battery plotted against the discharge voltage.

Therefore, an example of a discharging curve which is interesting for the present description is shown in FIG. 4B. This curve shows the time t plotted against the battery voltage Vt. This curve of FIG. 4B is simply plotted by bringing the values which were on the time axis in FIG. 4A to the Y-axis in FIG. 4B; and by bringing the values which were on the Y-axis in FIG. 4A to the X-axis in FIG. 4B. It may be found that this discharging curve has a form approaching the form of a curve "tanh". Therefore, the functions of the sigmoidal type are preferred for realizing the activating functions in the neurons of the hidden layer.

FIG. 4B thus shows a discharging curve giving the time t in minutes plotted against the voltage Vt in volts, which shows substantially flat end parts and a central part which has a steep slope. Therefore, in the first neural network NN1, the modelling of the middle part of the discharging curves of the relation 1a is carried out by the two first neural cells CN1A, CN2A of the hidden layer, of which the activating functions respectively have a steep slope; whereas the modelling of the end parts of these curves is carried out by the following hidden neural cells CN3A, CN4A which show an activating function which has a less steep slope.

The presence of hidden cells which have activating functions and show slopes which are considerably different amounts to specializing each hidden cell when predetermined different tasks are executed. It will be clear that the neural network NN1 could learn the task of producing the function Fw with the same level of performance, without this specialization existing. But, according to the invention, it has been found that the learning period of the neural network NN1 is found to be considerably shorter because each cell is dedicated to a predetermined task.

The slopes of the activating functions Si of the hidden cells NC1A, NC2A may be, for example, 7,0, and the slopes of the activating functions of the following hidden cells NC2A, NC4A may be, for example, 2,0.

For the learning period of the first neural network NN1, curves of discharging time t plotted against the discharge voltage V(t) are recorded, for example, every minute for a large number N of discharging cycles, and for a large number of batteries 110 of the same type, for example, nickel-cadmium batteries.

In an example, 20 batteries are used and undergo 140 discharging/charging cycles. A battery is considered fully charged when its voltage Vo=9V, and is considered to have reached the critical discharging threshold when its voltage reaches $V_{TH}$=6V. By this method, 20×140=2800 discharging curves are recorded, so that each curve produces 1600 points.

Each curve points at a different network NN1. Thus, in the learning period, 2800 networks are initialized, that is to say, 1 network per curve. In each curve, for example, half of the points, that is to say, 800 points are used for the learning of the corresponding neural network NN1 and, the other half of the points, that is to say, 800 other points, are used for testing said neural network NN1.

At the start of this learning period, which comprises the learning period and the tests, the thirteen weights WjA of each of the 2800 neural networks NN1 are stored in a RAM memory area referenced 170b in FIG. 5B.

On the basis thereof, the values of the batches of thirteen weights WjA in the memory will form a data base for the learning of the second neural network NN2.

The task of the second neural network NN2 is to learn a relation between parameters which depend on the battery discharge voltage. Thus, the second neural network NN2 receives:

No the initial number of cycles,

Vo the first recorded voltage of the respective discharging curve, and

ΔVo the slope at the start of this discharging curve, and is to be capable of calculating, on the basis of these measurements, the thirteen weights WjA necessary for the operation of the first neural network NN1. This relation is expressed by the function G of the relation (4a):

$$WjA=G(Vo, \Delta Vo, No) \tag{4a}$$

Figure 2B:
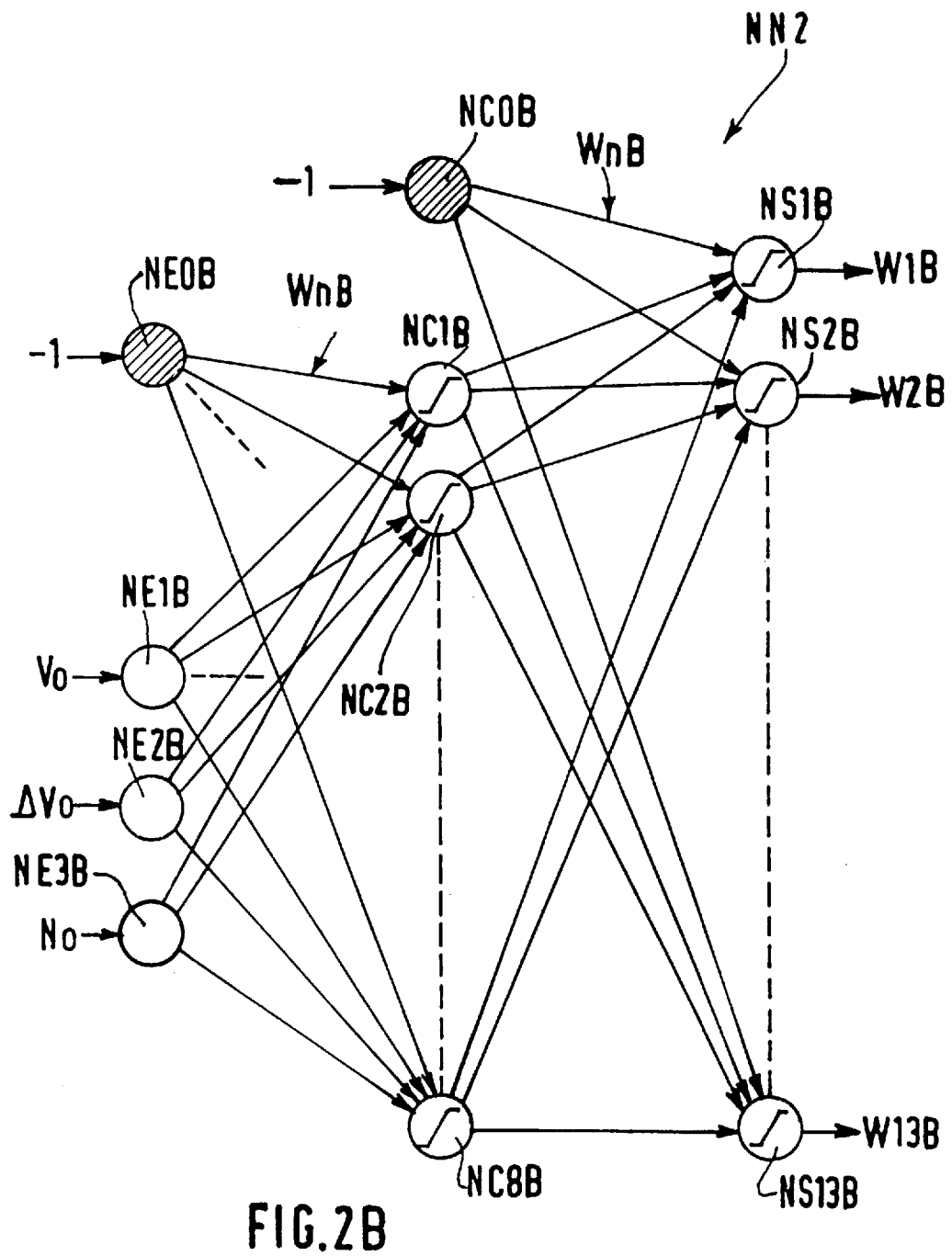
FIG. 2B represents a second neural network NN2 and FIG. 2C represents a third neural network for this monitoring system.

With reference to FIG. 2B, the structure of the second neural network NN2 is dictated by its task. This neural network NN2 comprises:

in input layer with three input cells EC1B, EC2B, EC3B, for the values Vo, ΔVo and No, plus an input cell EC0B for a threshold of −1;

thirteen output cells NS1B to NS13B for each of the thirteen respective approximate parameters WjB of the values neighboring the sought value of the weights of the first neural network;

a single hidden layer with eight hidden neural cells denoted NC1B to NC8B, plus one hidden cell NC0B for a threshold of −1.

According to the invention, the inputs formed by the initial values Vo and ΔVo have been specifically chosen, because it has appeared that they were the values that were most sensitive to the characteristics of the battery.

The third input formed by the initial number No of cycles has also been specifically chosen, because this input makes it possible to take account of an aging effect of the battery, because the more a battery is subjected to discharging/ charging cycles, the shorter its useful life will be, that is to say, the less the effect of recharging will be effective and the faster the discharging will be. This effect of aging is shown by FIG. 4C which shows in γ the measured points which correspond to the discharging period $t_{TH}$ to reach the critical threshold $V_{TH}$ from the initial instant to plotted against the initial number of cycles No. These measurements γ show that the larger the number of cycles already had is, the shorter the discharging time $t_{TH}$ will be.

The synaptic coefficients or weights, referenced WnB of this second neural network are fixed during its learning period and are stored in the ROM memory area 170a represented in FIG. 5B.

Attempts applied to the neural network NN2 have shown that such a network having eight hidden cells, which has for its function to activate a non-linear tangential hyperbolic function "tanh" is capable of properly managing the task assigned thereto.

It should be noted that, if the difference of the output cell NSA of the first neural network occurs, the output cells denoted NS1B to NS13B of the second neural network NN2 have a non-linear activating function, preferably "tanh".

Like the first neural network NN1, this second neural network NN2 has hidden cells of which the slope of the sigmoidal activating function differs from one cell to the next. This embodiment makes it possible not to use a large number of hidden cells.

Thus, the second neural network NN2 is entailed in that 1400 vectors are used of thirteen weight values generated via the learning of the first neural network NN1 by means of the 2800 recorded curves, and the 1400 other generated vectors are used for the tests.

The test procedure is realized in the following manner: for the 1400 vectors that do not belong to the learning batch, the corresponding initial values Vo, ΔVo and No are applied to the inputs of the second neural network. This network calculates an output vector of thirteen weight values WjB as this network has been induced to calculate.

Following this test method, these thirteen weight values WjB are imposed on a neural network NN1, at the same time as the predetermined critical discharge voltage value $V_{TH}$=6 volts is applied to its input EC1A. This first neural network NN1 thus calculates the predictive value automatically adapted to the discharging time $t_{TH}$ which is compared with that of the test curve.

With reference to FIG. 4C there is shown in a a predictive curve of discharging time plotted against the thus obtained number of cycles No.

In the learning period described above, the presence of the third neural network NN3 has been disregarded.

With reference to FIG. 4C, if this third neural network NN3 is not included in the circuit, curve α showing the predictive indication of discharging time $t_{TH}$ plotted against the number of cycles No differs from a curve which depends on the real measurements γ, that is to say, that the monitoring system makes an average error of about ten minutes when the instant $t_{TH}$ is predicted at which the battery will reach the critical voltage threshold $V_{TH}$.

It is thus important to correct this error which affects the predictive determining of this instant $t_{TH}$.

This error may be corrected by correcting the imposed weights for the operation of the first neural network. This is done in that the parameters WjB calculated by the second neural network NN2 are not fed directly to the first neural network NN1, because they are approximate values and are the cause of the error cited above. This is thus done by correcting these approximate parameters WjB by correction parameters WjC produced by the third neural network NN3 and which correction parameters have a like quantity to the number of approximate parameters WjB.

To end up at the best weights WjA of the first neural network NN1, the approximate parameters WjB and the correction parameters WjC are added together by the calculator 160 in its function of adder, and the result is imposed on this first neural network NN1.

Figure 1B:
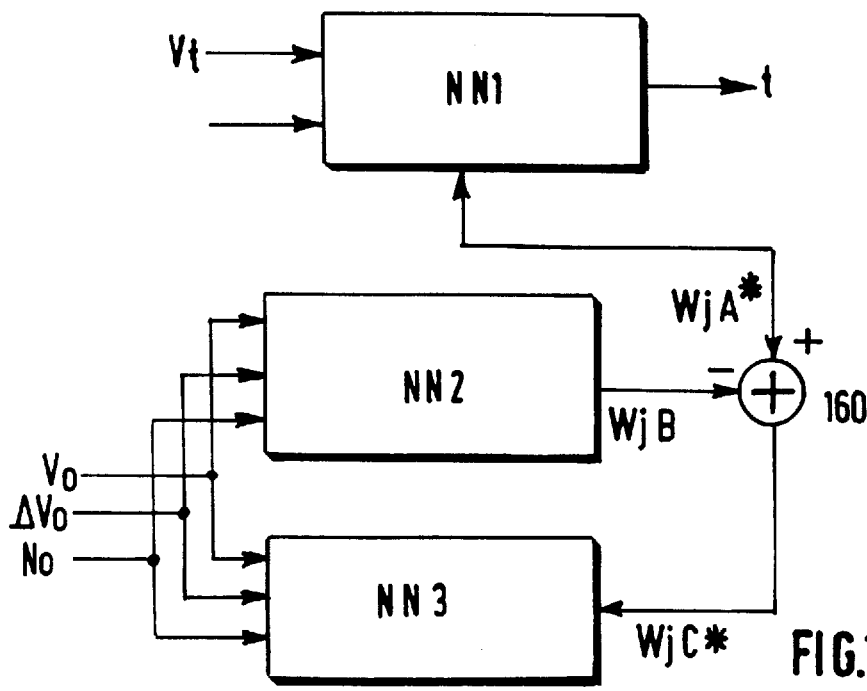
FIG. 1B represents the same monitoring system in a learning period in a consecutive charging period, for acquiring an adaptive function.

With reference to FIG. 1B, in the learning period, the third neural network NN3 learns to calculate its own synaptic coefficients or weights as adaptive values, to enable it to calculate the correction parameters WjB which, added to the approximate parameters WjA produced by the second neural network NN2, will form the synaptic coefficients or weights that are adapted best to the operation of the first neural network NN1. Thus, this first neural network NN1 having these adapted weights WjA could produce an indication, during the discharging period, which indication predicts the nearest critical instant $t_{TH}$ of the real value.

For example, with the use of this third neural network, the difference between the predictive indication β of $t_{TH}$ and the measurement γ is lowered to about 1 minute as is shown by the curves of FIG. 4C. This is a great advantage in obtaining precision of the predictive indications, because the monitoring system changes from one error of 10 minutes in the period of discharging of about 570 minutes, to 1 minute in these 570 minutes.

The monitoring system thus formed becomes a very precise system.

Figure 2C:
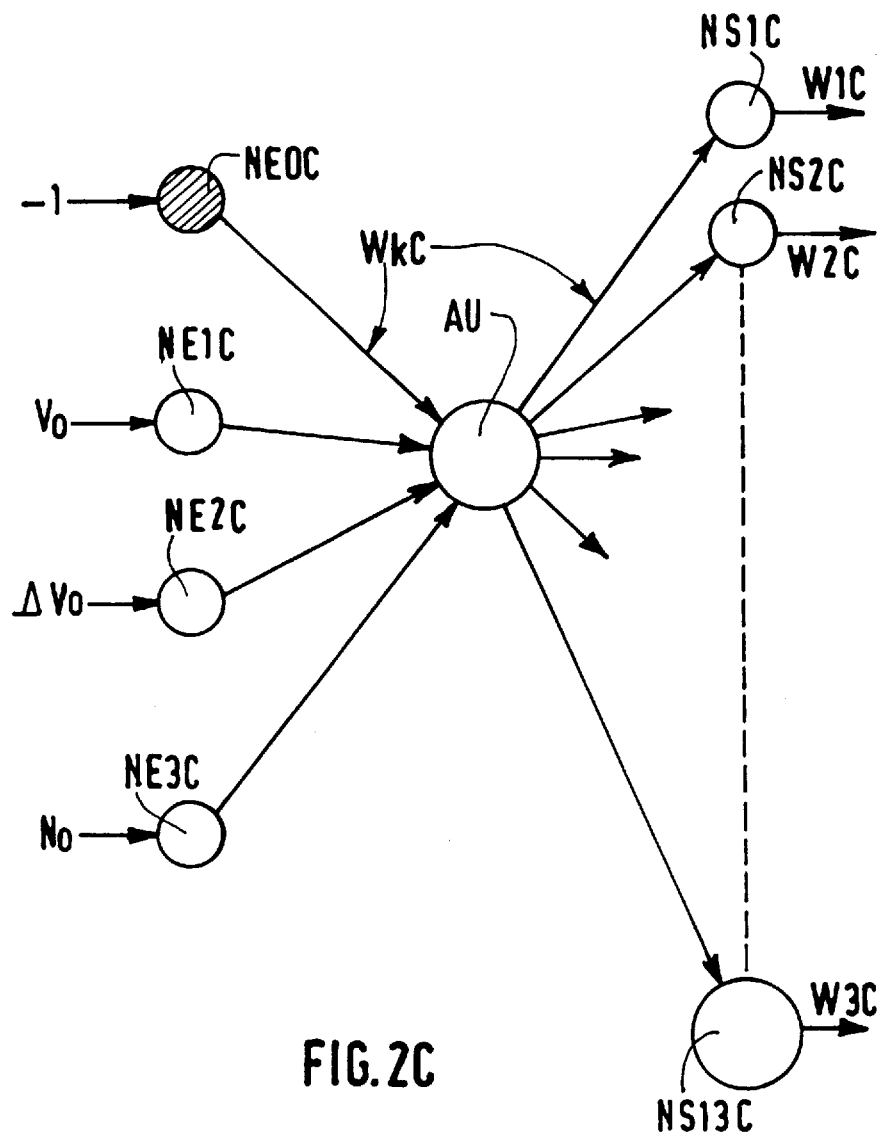

With reference to FIG. 2C, the third neural network NN3 receives:
No the initial number of cycles
Vo the first recorded voltage of the curve of the respective discharging curve, and
ΔVo the slope at the origin of this discharging curve, and is to be able to calculate the thirteen correction parameters WjC on the basis of these measurements which measurements cooperate to produce with the thirteen approximate weights WjB the weights WjA which are necessary for the operation of the first neural network NN1.

With reference to FIG. 2C, the structure of the third neural network NN3 is dictated by its task. This neural network NN3 comprises:
an input layer with three input cells EC1C, EC2C, EC3C for the values Vo, ΔVo and No, plus an input cell EC0C for a threshold of –1;
thirteen output cells NS1C to NS13C for each one of the respective thirteen correction parameters WjC. These output cells have identical activating functions to those of the corresponding output cells of the second neural network NN2, that is to say, sigmoidal functions "tanh" having the same slope;
a single hidden layer with 1 hidden neural cell denoted AU without a hidden cell for a threshold.

The third neural network requires for operation 4 synaptic coefficients at the input and thirteen synaptic coefficients at the output, that is, a total of 17 synaptic coefficients denoted WkC, where k is an index from 1 to 17.

With reference to FIG. 3, of which the legend is stated in Table III, it represents a block diagram illustrating the unrolling of the learning procedure of the third neural network NN3, this procedure comprises:
1) A first step illustrated by block 1, which corresponds to a first discharging period PD1; during this step:
the second neural network receives initial values Vo, ΔVo and No and calculates approximate parameters WjB, a RAM memory area 170b records instantaneous measurements which are produced by time measuring means 150a (FIG. 5A) and by voltage measuring means 150b of the rechargeable battery 110; these instantaneous measurements are recorded at each current instant of said first discharging period PD1, for example, every minute, and comprise the measurement of the current instant t and the measurement of the corresponding voltage value Vt.

2) A second step illustrated by block 2 of FIG. 3 and by FIG. 1B, which is brought to a successful issue during the time left for the calculator 160 and for the neural networks that correspond to a first charging period PC1 which follows the end of the first discharging period PD1; during this step, three sub-steps are brought to a successful issue:

2a) a sub-step illustrated by the block 2a during which:

the batches of instantaneous measurements Vt,t measured at each current instant of the preceding discharging period PD1 are imposed on the first neural network NN1, so that:

the instantaneous measured voltage value Vt is imposed on the input EC1A of the first neural network NN1, the instantaneous measurement of the corresponding instant t is imposed on the output NSA of the first neural network NN1.

Via a reverse propagation method known from the state of the art of neural networks, the first neural network NN1 calculates its thirteen internal weights which correspond to these imposed instantaneous real values. These thirteen calculated weights are called real weights and denoted WjA*. These weights WjA* are the thirteen best possible parameter values for the operation of the first neural network NN1 and which corresponds to the real discharging curve recorded during the preceding discharging period PD1.

2b) a sub-step illustrated by block 2b brought to a successful issue still during the charging period PC1, during which:

these thirteen best values of real weights WjA* are thereafter applied to the calculator 160. This calculator also receives the thirteen approximate parameters WjB which had been calculated by the second neural network NN2 during the previous discharging period PD1.

In this second sub-step 2b, the calculator 160 in its function of adder calculates the difference between these thirteen real weight values WjA* and these thirteen approximate parameters WjB so as to calculate thirteen error parameters denoted WjC*.

$$WjC^* = WjA^* - WjB$$

in which it will be recalled that j is a number from 1 to 13 that corresponds to the number of weights necessary for the operation of the first neural network in this example.

2c) A sub-step illustrated by block 2c always brought to a successful issue during the charging period PC1, and during which:

these thirteen error parameters WjC* are imposed on the respective thirteen outputs NS1C to NS13C of the third neural network NN3, whereas the initial values Vo, ΔVo and No used during the previous discharging period PD1 are imposed on its inputs EC1C to EC3C.

These thirteen error parameters WjC* are actually the best possible outputs of the third neural network NN3.

With the known reverse propagation method, the third neural network NN3 then calculates its own adaptive synaptic coefficients denoted WkC which are stored in a RAM memory area 170b.

3) This third step corresponds to a second discharging/charging cycle which starts with a new discharging period denoted PD2.

In this new discharging period PD2, the adaptive synaptic coefficients WkC, where k is a number from 1 to 17, similarly to the structure of third neural network represented in FIG. 2C which have been calculated during the charging period PC1 of the previous cycle, are maintained for another calculation of the synaptic coefficients of the first neural network NN1 as described before, while the monitoring system is operating.

With these adaptive synaptic coefficients WkC calculated in this manner, the third neural network NN3 produces in this new discharging period PD2, correction parameters WjC particularly well adapted to the correction of the approximate parameters WjB produced by the second neural network NN2.

The calculator 160 carries out this correction while adding together WjB+WjC which yields new synaptic coefficients which are adapted better for the first neural network NN1 in this second discharging period Modes of Operation of the Rechargeable-Battery Monitoring System The monitoring system 100 has three modes of operation called starting mode, current use mode, and adaptive mode.

The starting mode is utilized each time when the battery 110 has terminated a charging procedure of a discharging/charging cycle, and when it thus starts a new cycle with a discharging period. The moment the battery 110 is put in operation, the initial voltage Vo is immediately recorded. Then, at the instant t'o, after a very short lapse of time to–t'o=Δto has passed, preferably exactly 1 minute, the battery voltage is again recorded yielding a value denoted V'o, and the difference of initial voltage Vo–V'o=ΔVo is calculated, for example, by the calculator in its function of adder 160 shown in FIGS. 5A and 5B. Then, the two values Vo and ΔVo, at the same time as the initial number No of cycles that have already taken place, which number is calculated in that the calculator 160 is used, are applied to the input of the second neural network NN2 which then calculates the vector of thirteen weight values WjB to be applied to the first neural network NN1A.

The current use mode is utilized during the discharging period itself. In this current use mode the instantaneous voltage Vt is measured and stored every minute for updating the weights of the third neural network. The lapse of time $\Delta t_{TH}$ left before the battery reaches this predetermined critical voltage threshold $V_{TH}=6V$ is calculated as a difference between a time $t_{TH}$ and time t, where $t_{TH}$ is the output of the network NN1A when its input is set to $V_{TH}=6V$, and where t is the instant measured by the measuring means 150a. The indications of time $t_{TH}$ or lapse of time $\Delta t_{TH}$ are thus produced every minute.

The adaptive mode is utilized during the charging period and comprises the calculation of new synaptic weights Wkc for the third neural network NN3 based upon instantaneous real values Vt, where t is imposed on the first neural network NN1, based on the calculation of the real parameters WjA* and on the calculation of error parameters WjC* which refer to the third neural network NN3, according to the procedure described above with reference to FIGS. 1B and 3.

In a general manner, with reference to FIG. 5A, of which the legend is stated in Table I, the monitoring system 100 is utilized by a microprocessor 160 to carry out the calculations, and memory areas 170a, 170b for storing the data. These memory areas are accessible via the microprocessor 160 and include a ROM memory area. 170a for storing the structure data of the neural networks NN1, NN2 and NN3, the fixed parameters and the weights WnB of the second neural network, and a RAM memory area 170b for recording or producing, as the case may be, the variable measurements and the weight vectors WjA, WjC, WjA*, WjC* of the first and third neural networks. The microprocessor 160 carries out the calculations necessary for the operation of the monitoring system.

With reference to FIG. 5B, of which the legend is stated in Table II, the monitoring system 100 is coupled to display means 140 for giving the user an indication of time $t_{TH}$ or rather of the lapse of time $\Delta t_{TH}$ that is left from a current instant t of use onwards until the instant at which the battery will reach this predetermined critical voltage threshold $Vt_{TH}$, or also the two indications. The display means 140 may furthermore display the time, that is to say, an indication of the exact time; these display means may further display an indication when the charging period commences that follows the discharging period of the battery, when this charging period is terminated, when the battery has reached the initial voltage Vo=9V, for example.

As stated above, the monitoring system 100 forms part of a host device 130 which comprises connection means D1, D2 for the rechargeable battery 110. The rechargeable battery 110 is coupled to the monitoring system 100 to form the smart battery 120. The host device 130 further accommodates the measuring means 150, for example, a multimeter, the microprocessor 160, the memory areas 170a, 170b which are accessible via the microprocessor, and the display means 140.

For realizing the display means, various devices known from the state of the art can be used. A device may be a screen with indications written on it, or with indications drawn on it, or also a panel formed by diodes.

TABLE 1

(FIG. 5A)

| | |
|---|---|
| 150a | Time measuring means $t_o$, $t_o + \Delta_{to}$, t |
| 150b | Voltage measuring means $V_o$, $V_o + \Delta_{Vo}$, Vt |
| 110 | Rechargeable battery |
| 160 | Microprocessor for performing the calculations $\Delta t_{TH} = t - t_{TH}$, WjA = Wjb + Wjc, Wjc* = WjA* - WjB $\Delta Vo = Vo - V'o$, No |
| NN1 | First neural network |
| NN2 | Second neural network |
| NN3 | Third neural network |
| 170 | Memory areas |

TABLE II (FIG. 5B)

| | |
|---|---|
| 130 | Host device |
| D1, D2 | Connection of the host device and of the battery |
| 110 | Rechargeable battery |
| 150 | Time and voltage measuring means |
| 160 | Microprocessor for performing the calculations |
| 170a | ROM memory area |
| 170b | RAM memory area |
| 100 | Battery monitoring system |
| 120 | Smart battery |
| 140 | Display means for displaying the current instant and calculated times, and possibly the end of the charging period |

TABLE III (FIG. 3 and FIG. 1B)

| | |
|---|---|
| 1 | Discharging period PD1 Operation and start and current use 150a, 150 b} Vo, $\Delta$to, No initial values produce Vt, t instantaneous values NN2 produces WjB approximate weights |
| 2 | Next charging period PC1 Learning of NN3 for adaptivity |
| 2a | NN1 receives Vt on the input t on the output produces WjA* real weights |
| 2b | 160 receives WjA*, WjB produces the error parameters WjC* = WjA* - WjB |
| 2c | NN3 receives Vo, $\Delta$Vo, No on the input WjC* on the output produces its own adaptive weights WkC |
| 3 | Next discharging period Operation on initialisation and subsequent current use |

We claim:

1. A monitoring system for monitoring discharging/charging cycles of a battery coupled to a rechargeable battery having charging periods which alternate with discharging periods depending on discharging/charging cycles, this system comprising:

first adaptive calculation means (NN1) having three ports, said means are arranged for collecting, at the beginning of a discharging period of a discharging/charging cycle of the battery, on the first port, a batch of operating parameters called first parameters (WjA), and for receiving on the second port a predetermined value of a critical discharge voltage threshold ($V_{TH}$), and for producing on the third port a calculated predictive indication of the instant ($t_{TH}$) at which the battery will reach this critical threshold ($V_{TH}$) that corresponds to the end of this discharging period, said monitoring system also comprising:

second and third adaptive calculation means (NN2, NN3) coupled to the first calculation means, each having four ports and each are arranged for receiving, at an initial instant at the beginning of said discharging period of the battery, a value of the battery voltage called initial voltage (Vo) on the first port, a value of a variation ($\Delta$Vo) of this initial voltage after a short lapse of time starting from this initial instant on the second port, and a value of the initial number (No) of discharging/charging cycles of this battery effected before said discharging period on the third port, and which are arranged for producing, from the instant of said discharging period at which the initial values are available, a batch of approximate parameters (WjB) on the fourth port of said second calculator means (NN2), and a batch of corresponding correction parameters (WjC) on the fourth port of said third calculation means (NN3), which are added together to form said first operating parameters (WjA) imposed on the first port of said first calculation means (NN1).

2. A monitoring system as claimed in claim 1, also comprising:

a read/write memory area for recording, during said discharging period, batches of instantaneous real values, said real values being formed by a discharge voltage measurement (Vt) of the battery and by the current instant (t) corresponding to this measurement, and a calculator, in which system, during the battery charging period (PC1) following said discharging period (PD1) of the respective discharging/charging cycle:

the first calculation means (NN1) are furthermore arranged for calculating and producing, a posteriori in an autonomous manner, parameters called real parameters (WjA*) on said first port of said first calculation means which correspond to the operation of said first calculation means (NN1) in the situation when the batches of instantaneous real values are imposed, while the discharge voltage measurement (Vt) is imposed on its second port and the corresponding current instant (t) is imposed on its third port, the calculator (160) is arranged for receiving said approximate parameters (WjB) calculated by the second calculation means (NN2) during the discharging period (PD1), and said real parameters (WjA*) calculated by the first calculation means (NN1) during the charging period (PC1), and for producing respective differences between these parameters called error parameters (WjC*), and the third calculation means (NN3) are arranged for calculating autonomously parameters called adaptive parameters (WkC) which correspond to the operation of these third calculation means in the situation when the error parameters (WjC*) are imposed on its fourth port, whereas the initial values (Vo, ΔVo, No) of the previous discharging period (PD1) are imposed on its first through third ports, and in which system the third calculation means (NN3) save, as operating parameters in the later discharging period of the next discharging/charging cycle, the adaptive parameters (WkC) calculated in said charging period (PC1).

3. A monitoring system as claimed in claim 1, in which:

the first, second and third calculation means (NN1, NN2, NN3) are formed by a first, second and third neural network respectively, the first operating parameters are the synaptic coefficients (WjA) of the first neural network, the first neural network (NN1) having an input cell (EC1A) for a voltage value at its second node and an output cell (NSA) for a time value at its third node, the second neural network (NN2) having three input cells (NE1B, NE2B, NE3B) for said initial values (Vo, ΔVo, No) at its first through third ports, and a number of output cells (NE1B–NE13B) at its fourth port for the approximate parameters (WjB) having a like quantity to the synaptic coefficients (WjA) of the first neural network (NN1), and the third neural network (NN3) having three input cells (NE1C, NE2C, NE3C) for said initial values (Vo, ΔVo, No) at its first through third port and a number of output cells at its fourth port (NS1C–NS13C) for the correction parameters (WjC) having a like quantity to the number of synaptic coefficients (WjA) of the first neural network (NN1), and in which monitoring system:

the calculator (160) is arranged for receiving and adding together the approximate parameters (WjB) and the correction parameters (Wjc) and for producing said synaptic coefficients (WjA) imposed on the first neural network (NN1).

4. A monitoring system as claimed in claim 3, in which:

the first neural network (NN1), which forms the first calculation means, is arranged for calculating during the charging period (PC1) that follows the discharging period (PD1) of the respective discharging/charging cycle, by a reverse propagation method, real parameters (WjA*) which are its own real synaptic coefficients, in the situation when for each batch of instantaneous real values the measurement of the discharge voltage (Vt) is imposed on its second port, and the corresponding current instant (t) is imposed on its third port, the calculator (160) is arranged for producing the error parameters (WjC*) formed by the respective differences between said real synaptic coefficients (WjA*) calculated by the first neural network (NN1) during said charging period (PC1), and said approximate parameters (WjB) calculated by the second neural network (NN2) for said previous discharging period (PD1), the third neural network (NN3) forming the third calculation means is arranged for calculating, via a reverse propagation method, adaptive parameters (WkC) which are its own adaptive synaptic coefficients, in the situation when the error parameters (WkC*) are imposed on its fourth port and the initial values (Vo, ΔVo, No) of the previous discharging period (PD1) are imposed on its first through third ports, and this third neural network (NN3) in the subsequent discharging period (PD2) of the next discharging/charging cycle maintains these adaptive synaptic coefficients (WkC) calculated in said charging period.

5. A monitoring system as claimed in claim 1, in which:
the calculator is also arranged for calculating and producing at each current instant (t), on the basis of the measurement of this current instant (t) and on the basis of the predictive indication of the critical instant ($t_{TH}$) produced by the first adaptive calculation means, a predictive indication of the lapse of time ($\Delta t_{TH}$) that is left from this current instant (t) onwards until the critical instant ($t_{TH}$) at which the battery will reach the predetermined critical discharge voltage threshold ($V_{TH}$).

6. A monitoring system as claimed in claim 3, in which:

the calculator is also arranged for calculating and producing at each current instant (t), on the basis of the measurement of this current instant (t) and on the basis of the predictive indication of the critical instant ($t_{TH}$) produced by the first neural network, a predictive indication of the lapse of time ($\Delta t_{TH}$) that is left from this current instant (t) onwards until the critical instant ($t_{TH}$) at which the battery will reach its predetermined critical discharge voltage threshold ($V_{TH}$).

7. A monitoring system as claimed in claim 3, in which the second neural network (NN2) is combined in series with the first neural network (NN1), and in which the third neural network (NN3) is combined in parallel with the second neural network.

8. A monitoring system as claimed in claim 7, in which the first neural network (NN1) has three layers, of which one input layer of a neural cell (NE1A) for a voltage value has a hidden layer of neural cells and an output layer having a single neural cell (NSA), the cells of the hidden layer having a sigmoidal activating function with slopes varying from one cell to the next, and the cell of the output layer having a linear activating function.

9. A monitoring system as claimed in claim 8, in which the second neural network (NN2) has three neural cell layers, of which one input layer of three neural cells (NE1B, NE2B, NE3B) for each of the initial values (Vo, ΔVo, No), one layer of hidden cells, and one output layer of neural cells (NS1B–NS13B), the cells of the hidden layer (NC1B–NC8B) having a sigmoidal activating function with different slopes from one cell to the next, and the cells of the output layer having a like quantity to the number of synaptic coefficients which are necessary for the operation of the first neural network and having a sigmoidal activating function.

10. A monitoring system as claimed in claim 9 in which the third neural network (NN3) has three neural cell layers, of which one input layer of three neural cells (NE1C, NE2C, NE3C) for each of the initial values (Vo, ΔVo, No), one layer of a single hidden cell (AU), and one output layer of neural cells (NS1C–NS13C), the cells of the output layer having a like quantity to the number of synaptic coefficients necessary for the operation of the first neural network (NN1), and having a sigmoidal activating function.

11. A monitoring system as claimed in claim 4, comprising a microprocessor for performing the calculations to form the first, second and third neural networks, and the calculator, and memory areas for storing the data, these memory areas being accessible via the microprocessor and including a memory area for storing the structure data of the neural networks, the fixed parameters and the synaptic coefficients of the second neural network, and a random access memory area for storing or producing the variable measurements, and the synaptic coefficients of the first and of the third neural networks.

12. A monitoring system as claimed in claim 1, this system being coupled to a rechargeable battery, to time measuring means, voltage measuring means, and display means arranged for producing either an indication of the critical instant ($t_{TH}$) at which the battery will reach the critical voltage threshold ($vt_{TH}$), or an indication of the lapse of time ($\Delta t_{TH}$) that is left from a current instant of use (t) onwards until the instant ($t_{TH}$) at which the battery will reach a predetermined critical voltage threshold ($Vt_{TH}$), or the two indications, and possibly an indication of the end of the recharging period of the battery.

13. A host device fed by a rechargeable battery and comprising a monitoring system as claimed in claim 1, coupled to this battery.

14. Method of producing neural networks of the monitoring system as claimed in claim 7, comprising in a learning period:
the learning by the first neural network, of discharging time curves (t) as a function of the discharge voltage (Vt) during which discharge voltages (Vt) are imposed on the second port of the first neural network normally intended for the voltage value, and the corresponding instants (t) are imposed on the third port for forming a data base formed by vectors of the synaptic coefficients (WjA) of this first neural network,
the learning by the second neural network of relations between the initial values (Vo, ΔVo, No) and the synaptic coefficients (WjA) of the first neural network, determined in its learning procedure,
the learning of the third neural network to make it determine its own adaptive synaptic coefficients (WkC), this learning comprising the steps of:
1) in the discharging period (PD1) of a discharging/charging cycle of the battery, storing the initial values (Vo, ΔVo, No) and instantaneous real values of the battery voltage (Vt) as a function of the corresponding current instant (t), and approximate parameters (WjB) produced by the second neural network (NN2),
2) in the subsequent charging period (PC1), this learning comprising the sub-steps of:
2a) calculating by the first neural network its own real synaptic coefficients (WjA*) when the instantaneous voltage (Vt) and time (t) values are imposed on its second and third ports respectively,
2b) calculating error parameters (WjC*) by calculating the differences between the real parameters (WjA*) and the approximate parameters (WjB),
2c) calculating by the third neural network (NN3) its own synaptic coefficients (WkC) called adaptive parameters when the error parameters (WjC*) are imposed on its fourth port and the initial values (Vo, ΔVo, No) are imposed on its first through third ports, and
method of use of the monitoring system comprising the use of said adaptive parameters (WkC) as synaptic coefficients of the third neural network (NN3) in the later discharging period of the next discharging/charging cycle.

15. A monitoring system as claimed in claim 2, in which:
the first, second and third calculation means (NN1, NN2, NN3) are formed by a first, second and third neural network respectively, the first operating parameters are the synaptic coefficients (WjA) of the first neural network, the first neural network (NN1) having an input cell (EC1A) for a voltage value at its second node and an output cell (NSA) for a time value at its third node,
the second neural network (NN2) having three input cells (NE1B, NE2B, NE3B) for said initial values (Vo, ΔVo, No) at its first through third ports, and a number of output cells (NE1B–NE13B) at its fourth port for the approximate parameters (WjB) having a like quantity to the synaptic coefficients (WjA) of the first neural network (NN1), and the third neural network (NN3) having three input cells (NE1C, NE2C, NE3C) for said initial values (Vo, ΔVo, No) at its first through third port and a number of output cells at its fourth port (NS1C–NS13C) for the correction parameters (WjC) having a like quantity to the number of synaptic coefficients (WjA) of the first neural network (NN1), and in which monitoring system:
the calculator (160) is arranged for receiving and adding together the approximate parameters (WjB) and the correction parameters (WjC) and for producing said synaptic coefficients (WjA) imposed on the first neural network (NN1).

16. A monitoring system as claimed in claim 15, in which:
the first neural network (NN1), which forms the first calculation means, is arranged for calculating during the charging period (PC1) that follows the discharging period (PD1) of the respective discharging/charging cycle, by a reverse propagation method, real parameters (WjA*) which are its own real synaptic coefficients, in the situation when for each batch of instantaneous real values the measurement of the discharge voltage (Vt) is imposed on its second port, and the corresponding current instant (t) is imposed on its third port,
the calculator (160) is arranged for producing the error parameters (WjC*) formed by the respective differences between said real synaptic coefficients (WjA*) calculated by the first neural network (NN1) during said charging period (PC1), and said approximate parameters (WjB) calculated by the second neural network (NN2) for said previous discharging period (PD1), the third neural network (NN3) forming the third calculation means is arranged for calculating, via a reverse propagation method, adaptive parameters (WkC) which are its own adaptive synaptic coefficients, in the situation when the error parameters (WkC*) are imposed on its fourth port and the initial values (Vo, ΔVo, No) of the previous discharging period (PD1) are imposed on its first through third ports, and this third neural network (NN3) in the subsequent discharging period (PD2) of the next discharging/charging cycle maintains these adaptive synaptic coefficients (WkC) calculated in said charging period.

17. A monitoring system as claimed in claim 2, in which: the calculator is also arranged for calculating and producing at each current instant (t), on the basis of the measurement of this current instant (t) and on the basis of the predictive indication of the critical instant ($t_{TH}$) produced by the first adaptive calculation means, a predictive indication of the lapse of time ($\Delta t_{TH}$) that is left from this current instant (t) onwards until the critical instant ($t_{TH}$) at which the battery will reach the predetermined critical discharge voltage threshold ($V_{TH}$).

18. A monitoring system as claimed in claim 4, in which: the calculator is also arranged for calculating and producing at each current instant (t), on the basis of the measurement of this current instant (t) and on the basis of the predictive indication of the critical instant ($t_{TH}$) produced by the first neural network, a predictive indication of the lapse of time ($\Delta t_{TH}$) that is left from this current instant (t) onwards until the critical instant ($t_{TH}$) at which the battery will reach its predetermined critical discharge voltage threshold ($V_{TH}$).

19. A monitoring system as claimed in claim 15, in which: the calculator is also arranged for calculating and producing at each current instant (t), on the basis of the measurement of this current instant (t) and on the basis of the predictive indication of the critical instant ($t_{TH}$) produced by the first neural network, a predictive indication of the lapse of time ($\Delta t_{TH}$) that is left from this current instant (t) onwards until the critical instant ($t_{TH}$) at which the battery will reach its predetermined critical discharge voltage threshold ($V_{TH}$).

20. A monitoring system as claimed in claim 16, in which: the calculator is also arranged for calculating and producing at each current instant (t), on the basis of the measurement of this current instant (t) and on the basis of the predictive indication of the critical instant ($t_{TH}$) produced by the first neural network, a predictive indication of the lapse of time ($\Delta t_{TH}$) that is left from this current instant (t) onwards until the critical instant ($t_{TH}$) at which the battery will reach its predetermined critical discharge voltage threshold ($V_{TH}$).

21. A monitoring system as claimed in claim 4, in which the second neural network (NN2) is combined in series with the first neural network (NN1), and in which the third neural network (NN3) is combined in parallel with the second neural network.

22. A monitoring system as claimed in claim 6, in which the second neural network (NN2) is combined in series with the first neural network (NN1), and in which the third neural network (NN3) is combined in parallel with the second neural network.

23. A monitoring system as claimed in claim 15, in which the second neural network (NN2) is combined in series with the first neural network (NN1), and in which the third neural network (NN3) is combined in parallel with the second neural network.

24. A monitoring system as claimed in claim 10, comprising a microprocessor for performing the calculations to form the first, second and third neural networks, and the calculator, and memory areas for storing the data, these memory areas being accessible via the microprocessor and including a memory area for storing the structure data of the neural networks, the fixed parameters and the synaptic coefficients of the second neural network, and a random access memory area for storing or producing the variable measurements, and the synaptic coefficients of the first and of the third neural networks.

25. A monitoring system as claimed in claim 16, comprising a microprocessor for performing the calculations to form the first, second and third neural networks, and the calculator, and memory areas for storing the data, these memory areas being accessible via the microprocessor and including a memory area for storing the structure data of the neural networks, the fixed parameters and the synaptic coefficients of the second neural network, and a random access memory area for storing or producing the variable measurements, and the synaptic coefficients of the first and of the third neural networks.

26. A monitoring system as claimed in claim 3, this system being coupled to a rechargeable battery, to time measuring means, voltage measuring means, and display means arranged for producing either an indication of the critical instant ($t_{TH}$) at which the battery will reach the critical voltage threshold ($vt_{TH}$), or an indication of the lapse of time ($\Delta t_{TH}$) that is left from a current instant of use (t) onwards until the instant ($t_{TH}$) at which the battery will reach a predetermined critical voltage threshold ($Vt_{TH}$), or the two indications, and possibly an indication of the end of the recharging period of the battery.

27. A monitoring system as claimed in claim 4, this system being coupled to a rechargeable battery, to time measuring means, voltage measuring means, and display means arranged for producing either an indication of the critical instant ($t_{TH}$) at which the battery will reach the critical voltage threshold ($vt_{TH}$), or an indication of the lapse of time ($\Delta t_{TH}$) that is left from a current instant of use (t) onwards until the instant ($t_{TH}$) at which the battery will reach a predetermined critical voltage threshold ($Vt_{TH}$), or the two indications, and possibly an indication of the end of the recharging period of the battery.

28. A monitoring system as claimed in claim 11, this system being coupled to a rechargeable battery, to time measuring means, voltage measuring means, and display means arranged for producing either an indication of the critical instant ($t_{TH}$) at which the battery will reach the critical voltage threshold ($vt_{TH}$), or an indication of the lapse of time ($\Delta t_{TH}$) that is left from a current instant of use (t) onwards until the instant ($t_{TH}$) at which the battery will reach a predetermined critical voltage threshold ($Vt_{TH}$), or the two indications, and possibly an indication of the end of the recharging period of the battery.

29. A host device fed by a rechargeable battery and comprising a monitoring system as claimed in claim 28, coupled to this battery.

30. Method of producing neural networks of the monitoring system as claimed in claim 12, comprising in a learning period:

the learning by the first neural network, of discharging time curves (t) as a function of the discharge voltage (Vt) during which discharge voltages (Vt) are imposed on the second port of the first neural network normally intended for the voltage value, and the corresponding instants (t) are imposed on the third port for forming a data base formed by vectors of the synaptic coefficients (WjA) of this first neural network, the learning by the second neural network of relations between the initial values (Vo, ΔVo, No) and the synaptic coefficients (WjA) of the first neural network, determined in its learning procedure, the learning of the third neural network to make it determine its own adaptive synaptic coefficients (WkC), this learning comprising the steps of:

1) in the discharging period (PD1) of a discharging/charging cycle of the battery, storing the initial values (Vo, ΔVo, No) and instantaneous real values of the battery voltage (Vt) as a function of the corresponding current instant (t), and approximate parameters (WjB) produced by the second neural network (NN2), 2) in the subsequent charging period (PC1), this learning comprising the sub-steps of:

2a) calculating by the first neural network its own real synaptic coefficients (WjA*) when the instantaneous voltage (Vt) and time (t) values are imposed on its second and third ports respectively, 2b) calculating error parameters (WjC*) by calculating the differences between the real parameters (WjA*) and the approximate parameters (WjB), 2c) calculating by the third neural network (NN3) its own synaptic coefficients (WkC) called adaptive parameters when the error parameters (WjC*) are imposed on its fourth port and the initial values (Vo, ΔVo, No) are imposed on its first through third ports, and method of use of the monitoring system comprising the use of said adaptive parameters (WkC) as synaptic coefficients of the third neural network (NN3) in the later discharging period of the next discharging/charging cycle.

31. Method of producing neural networks of the monitoring system as claimed in claim 24, comprising in a learning period:

the learning by the first neural network, of discharging time curves (t) as a function of the discharge voltage (Vt) during which discharge voltages (Vt) are imposed on the second port of the first neural network normally intended for the voltage value, and the corresponding instants (t) are imposed on the third port for forming a data base formed by vectors of the synaptic coefficients (WjA) of this first neural network, the learning by the second neural network of relations between the initial values (Vo, ΔVo, No) and the synaptic coefficients (WjA) of the first neural network, determined in its learning procedure, the learning of the third neural network to make it determine its own adaptive synaptic coefficients (WkC), this learning comprising the steps of:

1) in the discharging period (PD1) of a discharging/charging cycle of the battery, storing the initial values (Vo, ΔVo, No) and instantaneous real values of the battery voltage (Vt) as a function of the corresponding current instant (t), and approximate parameters (WjB) produced by the second neural network (NN2), 2) in the subsequent charging period (PC1), this learning comprising the sub-steps of:

2a) calculating by the first neural network its own real synaptic coefficients (WjA*) when the instantaneous voltage (Vt) and time (t) values are imposed on its second and third ports respectively, 2b) calculating error parameters (WjC*) by calculating the differences between the real parameters (WjA*) and the approximate parameters (WjB), 2c) calculating by the third neural network (NN3) its own synaptic coefficients (WkC) called adaptive parameters when the error parameters (WjC*) are imposed on its fourth port and the initial values (Vo, ΔVo, No) are imposed on its first through third ports, and method of use of the monitoring system comprising the use of said adaptive parameters (WkC) as synaptic coefficients of the third neural network (NN3) in the later discharging period of the next discharging/charging cycle.

* * * * *